United States Patent [19]

Duffy et al.

[11] 4,100,433
[45] Jul. 11, 1978

[54] VOLTAGE TO CURRENT CONVERTER CIRCUIT

[75] Inventors: William Thomas Duffy; William Joseph Lillis, both of Tempe, Ariz.

[73] Assignee: Motorola, Inc., Schaumburg, Ill.

[21] Appl. No.: 756,922

[22] Filed: Jan. 4, 1977

[51] Int. Cl.² .................... G06G 7/12; G06G 7/24
[52] U.S. Cl. ..................... 307/229; 307/230; 307/260; 328/145
[58] Field of Search .............. 307/229, 230, 260; 330/19, 20, 22, 40, 30 D; 328/145

[56] References Cited

U.S. PATENT DOCUMENTS

| | | | |
|---|---|---|---|
| 3,852,688 | 12/1974 | Takeda | 328/145 |
| 3,879,668 | 4/1975 | Edwards | 328/145 |
| 4,004,247 | 1/1977 | Van de Plassche | 330/22 |

*Primary Examiner*—Stanley D. Miller, Jr.
*Assistant Examiner*—B. P. Davis

*Attorney, Agent, or Firm*—Michael D. Bingham

[57] ABSTRACT

A monolithic circuit is disclosed which is suitable for providing a pair of logarithmic differential output current signals in response to an applied linear control voltage. The circuit comprises first and second operational amplifiers connected as voltage followers which act as low impedance driving sources. The linear control voltage is applied to a first one of the operational amplifiers and a reference voltage to the other. These two voltages substantially appear at the respective outputs of the operational amplifiers and are summed across a resistor connected therebetween to establish a difference potential thereacross of which the magnitude is a function of the applied input voltage. The difference potential is utilized to differentially drive the base emitter junctions of a pair of transistors which establish differential logarithmic currents at the collectors thereof.

13 Claims, 1 Drawing Figure

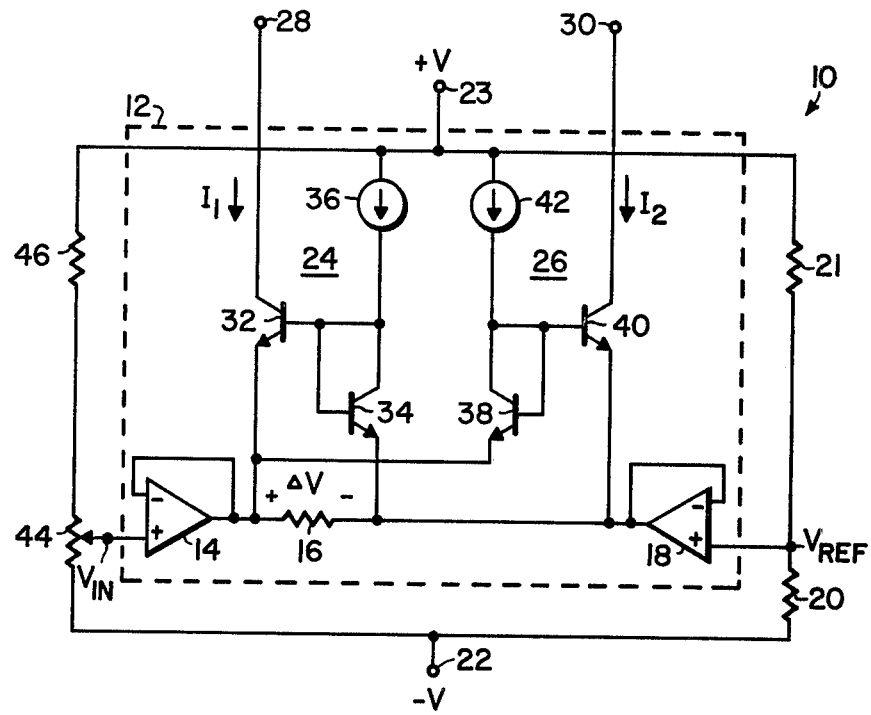

VOLTAGE TO CURRENT CONVERTER CIRCUIT

BACKGROUND OF THE INVENTION

This invention relates to converter circuits and more particularly to a monolithic integrated circuit for producing a pair of logarithmic differential output currents in response to an applied linear voltage.

The circuit of the present invention may be used in audio circuits to linearly vary the gain, in decibels, versus percent rotation of the linear potentiometer. A direct application of such a circuit is the utilization thereof in a transceiver system for simultaneously increasing the gain of one channel (either transmit or receive) and decreasing the gain in the other channel to maintain a constant system gain.

One particular application of the circuit of the invention is in speaker phone circuits for differentially controlling the gains of the transmit and receive channels. In some contemporary speaker phone systems the close proximity of the speaker to the microphone has caused oscillation problems. In order to overcome oscillation, these prior art systems have required a total system gain equal to some predetermined constant value. To maintain this constant value sensing circuitry is provided to determine in what mode (transmit or receive) the system is in so that the gain of that particular channel is maximized simultaneously with minimizing the gain of the other channel. This in effect has prevented these prior art systems from being a true transceiver circuit, i.e., a user cannot simultaneously talk and listen using the prior art system.

The circuit of the present invention may be utilized to overcome the shortcomings of the prior art systems. The differential output currents provided by the present invention may be utilized to automatically and differentially vary the gain of the transmit and receive channels in response to voice control. Therefore, the circuit of the present invention can provide instantaneous two-way communication not presently realizable in some contemporary speaker phone systems.

It is further contemplated that the circuit of the present invention may be utilized in similar audio circuits such as citizen band radios. The hand held mike presently required could then be replaced to provide hands off two-way radio communication.

SUMMARY OF THE INVENTION

Accordingly, it is an object of the present invention to provide an improved voltage to current converter circuit.

It is another object of the present invention to provide a circuit capable of providing logarithmic differential output currents in response to an applied linear input voltage.

It is a further object of the present invention to provide a monolithic integrated voltage to current converter circuit for producing logarithmic differential output currents in response to an applied linear voltage.

In accordance with the foregoing there is provided a voltage to current converter circuit comprising: an input circuit adapted to receive a reference potential and a linear input voltage for establishing a difference voltage the magnitude of which varies proportionally with the magnitude of the linear input voltage at first and second output terminals; a first circuit and a second circuit differentially coupled to the input circuit. The first circuit includes an electron control device having first, second and control electrodes with the first and control electrodes thereof being coupled respectively to the first and second output terminals of the input circuit. The second circuit includes an electron control device having first, second and control electrodes with the first and control electrodes thereof being coupled respectively to the second and first output terminals of the input circuit. The second electrodes of each of the electron control devices of the first and second circuits provide the output terminals of the converter circuit.

BRIEF DESCRIPTION OF THE DRAWING

There is illustrated in the single FIGURE the voltage to current converter circuit of the present invention.

DETAILED DESCRIPTION OF THE INVENTION

There is illustrated in the single FIGURE, voltage to current converter circuit 10 of the present invention. The elements contained within dashed outline 12 comprising converter circuit 10 are suitable to be manufactured in monolithic integrated circuit form.

Converter circuit 10 comprises operational amplifier 14 which is connected in a voltage follower configuration and is adapted to receive a linear input voltage at the non-inverting input terminal thereof. The output of operational amplifier 14 is connected to one terminal of summing resistor 16 the other terminal thereof being connected to the output of operational amplifier 18. Operational amplifier 18, also connected in voltage follower configuration is adapted to receive a substantially fixed reference voltage, $V_{REF}$, at the non-inverting input terminal thereof. A difference voltage, $\Delta V$, is derived across the terminals of summing resistor 16 which has a magnitude proportional to the difference between the magnitudes of the linear input voltage applied to operational amplifier 14 and the magnitude of $V_{REF}$. Since $V_{REF}$ is of substantially constant magnitude (being established by the resistor divider circuit comprising resistors 20 and 21), as $V_{IN}$ is varied, $\Delta V$ will be varied a proportionate amount. The resistor divider circuit is coupled between reference terminal 22 (which may be at ground potential) and power supply terminal 23 which is adapted to receive an operating bias potential, $+V$.

Connected across summing resistor 16 are mirror image circuits 24 and 26 which, as will be explained, produce differential logarithmic currents at output terminals 28 and 30 respectively. The differential magnitudes of the logarithmic currents are proportional to the magnitude of the difference voltage, $\Delta V$, developed across summing resistor 16.

Circuit 24 is illustrated as comprising NPN transistor 32 having the collector electrode thereof being adapted to be connected to output terminal 28. The emitter electrode of transistor 32 is connected to the first terminal of summing resistor 16 and to the output of operational amplifier 14. As understood, transistor 34 is connected in a diode configuration between the base electrode of transistor 32 and the other terminal of summing resistor 16 to the output of operational amplifier 18. Connected between power supply terminal 23 and the base electrode of transistor 32 is current source 36. Circuit 26, being a mirror image of circuit 24, includes diode configured transistor 38, transistor 40 which has the collector electrode thereof connected to output terminal 30, and current source 42.

For brevity, the operation of circuit 24 is described hereinbelow, it being understood that circuit 26 functions in a like manner. In response to the magnitude of $V_{IN}$ being varied as, for example, by moving the wiper arm of linear potentiometer 44 which is connected in series with resistor 46 between power supply voltage $+V$ and reference potential $-V$, the magnitude of $\Delta V$ is varied. Solving for the loop voltages, it can be shown that:

$$I_1 = (I_{36} I_{32}/I_{34}) \exp(-\Delta V/K) \qquad (1)$$

where:

$I_{36}$ is the current supplied from current source 36;

$I_{34}$ is the saturation current of diode connected transistor 34;

$I_{32}$ is the saturation current of transistor 32; and

K is equal to the constant $(kT/q)$.

Thus, output current $I_1$ varies exponentially with respect to the magnitude of the difference voltage $\Delta V$. Similarly, output current $I_2$ can be shown to be equal to:

$$I_2 = (I_{42} I_{40}/I_{38}) \exp(\Delta V/K) \qquad (2)$$

where:

$I_{42}$ is the current supplied from current source 42;

$I_{40}$ is the saturation current of transistor 40; and $I_{38}$ is the saturation current of diode connected transistor 39.

If all of the devices are matched during fabrication of integrated circuit 12, then:

$$(I_{36} I_{32}/I_{34}) = (I_{42} I_{40}/I_{38}) = I_0 \qquad (3)$$

$$I_1 = I_0 e^{(-\Delta V/K)} \qquad (4)$$

$$I_2 = I_0 e^{(-\Delta V/K)} \qquad (5)$$

Therefore, as the magnitude increases, $I_1$ decreases and $I_2$ increases and vice versa. Thus, in response to the linear input voltage $V_{IN}$, a pair of logarithmic differential output currents are produced.

By varying the ratios of the base areas of respective transistors 32, 34 and 38, 40 the ratio of the saturation currents may be varied as is understood. The circuit of the present invention can thereby be used to simultaneously generate any set of output current curves of the form $I_1 = I_x 10^{-KV}$ and $I_2 = I_y 10^{KV}$.

What is claimed is:

1. A voltage to current converter circuit, comprising:

circuit means adapted to receive both a reference potential and a linear input voltage for establishing a difference voltage across first and second output terminals thereof, the magnitude of said difference voltage being a linear function of the magnitude of said linear input voltage;

first circuit means including first electron control means having first, second and control electrodes for producing at said second electrode a first logarithmic current signal, the magnitude of said first logarithmic current signal being caused to vary as said magnitude of said difference voltage is varied, said first and control electrodes of said first electron control means being coupled respectively to said first and second terminals of said circuit means for establishing a differential voltage; and second circuit means including second electron control means having first, second and control electrodes for producing at said second electrode a second logarithmic current signal, the magnitude of said second logarithmic current signal having a slope thereto which is opposite in polarity to the slope of said first current signal, said first and control electrodes of said second electron control means being coupled respectively to said second and first terminals of said circuit means for establishing a difference voltage.

2. The circuit of claim 1 wherein said circuit means for establishing a difference voltage includes:

a first operational amplifier connected in a voltage follower configuration having an input adapted to receive said linear input voltage and an output;

a second operational amplifier connected in a voltage follower configuration having an input adapted to receive said reference potential and an output; and resistive means coupled between said outputs of said first and second operational amplifiers, said difference voltage being developed thereacross.

3. The circuit of claim 2 wherein said first circuit means includes:

a first diode means coupled between said control electrode of said first electron control means and said second terminal of said means for establishing a difference voltage; and first current source means for supplying a first current to said first electron control means and said first diode means, said first current source being connected to said control electrode of said first electron control means.

4. The circuit of claim 3 wherein said second circuit means includes:

a second diode means coupled between said control electrode of said second electron control means and said first terminal of said means for establishing a difference voltage; and second current source means for supplying a second current to said second electron control means and to said second diode means, said second current source means being connected to said control electrode of said second electron control means.

5. Apparatus suitable for converting an applied linear input voltage signal into a pair of logarithmic differential output current signals, comprising:

means for supplying a reference potential;

circuit means having first and second terminals for developing a difference potential thereacross in response to both said reference potential and the input voltage signal being supplied thereto, the magnitude of said differential potential being related to the magnitude of the input voltage signal;

first low impedance circuit means including a first electron control means having first, second and control electrodes for producing a first logarithmic current signal at said second electrode, the magnitude of said first logarithmic current signal being a function of said difference voltage, said first and control electrode of said first electron control means being coupled respectively to said first and second terminals of said circuit means; and second low impedance circuit means including a second electron control means having first, second and control electrodes for producing a second logarithmic current signal at said second electrode, said second logarithmic current signal having a slope substantially equal to but of opposite polarity of said slope of said first logarithmic current signal, said first and control electrode of said second electron control means being coupled respectively to said second and first terminals of said circuit means.

6. The apparatus of claim 5 further including:
a first low impedance driving source adapted to receive the linear input voltage and having an output connected to said first terminal of said circuit means for driving said first low impedance circuit means; and
a second low impedance driving source adapted to receive said reference potential and having an output connected to said second terminal of said circuit means for driving said second low impedance circuit means.

7. The apparatus of claim 6 wherein:
said first low impedance means is an operational amplifier connected in a voltage follower configuration; and
said second low impedance means is an operational amplifier connected in a voltage follower configuration.

8. The apparatus of claim 7 wherein:
said first low impedance circuit means includes a third electron control means having a first electrode coupled to said second terminal of said circuit means, a second electrode coupled to said control electrode of said first electron control means; and
a first constant current source for supplying a constant current to said first and third electron control means, said first constant current source being connected to said second electrode of said third electron control means.

9. The apparatus of claim 8 wherein:
said second low impedance circuit means includes a fourth electron control means having first and second electrodes, said first electrode being coupled to said first terminal of said circuit means, said second electrode being coupled to said control electrode of said second electron control means; and
second constant current source for supplying a current to said second and fourth electron control means, said second current source being coupled to said second electrode of said fourth electron control means.

10. A monolithic integrated circuit for converting a linear voltage applied thereto into a pair of logarithmic differential current signals, comprising:
a first transistor device having first, second and control electrodes, said second electrode being adapted to be a first output of the circuit;
a first diode device having first and second electrodes, said second electrode connected to said control electrode of said first transistor device;
first current source means for providing a first current, said first current source means being connected to said second electrode of said first diode device;
a second transistor having first, second and control electrode, said second electrode being adapted to be another output of the circuit;
a second current source means for providing a second current, said second current source means being connected to said second electrode of said second diode device;
means for producing a reference voltage;
circuit means adapted to receive both the linear voltage and said reference voltage for producing a difference voltage thereacross the magnitude of which is proportional to the linear voltage, said circuit means having first and second terminals, said first terminal being coupled to said first electrode of said first transistor device and to said first electrode of said second diode device and said second terminal being coupled to said first electrodes of said first diode device and said second transistor device.

11. The circuit of claim 10 further including:
a first operational amplifier connected as a voltage follower which is adapted to receive the linear voltage and provides substantially the same at an output thereof which is coupled to said first terminal of said circuit means; and
a second operational amplifier connected as a voltage follower which is adapted to receive said reference voltage and providing substantially the same at an output thereof which is coupled to said second terminal of said circuit means.

12. A monolithic integrated voltage to current converter circuit, comprising:
first circuit means responsive to a difference voltage being applied thereto for providing a first logarithmic current at an output thereof having a magnitude which is caused to vary as the difference voltage is varied;
second circuit means responsive to said difference voltage being applied thereto for providing a second logarithmic current at an output thereof having a slope substantially equal to but of opposite phase of said first logarithmic current;
impedance means responsive to a linear voltage signal and a reference voltage applied thereacross for developing said difference voltage, the magnitude of said differential voltage varying in response to the magnitude of said linear voltage being varied;
means for applying said linear voltage to said impedance means.

13. A method for producing a pair of logarithmic, differential output currents in response to a linear voltage, comprising the steps of:
producing a difference voltage signal having a magnitude which is a function of the linear voltage;
providing a first circuit responsive to said difference voltage to generate a first logarithmic current signal having a first slope thereto, the magnitude of said first current siganl varying in a predetermined manner as the magnitude of the linear voltage is varied; and
providing a second circuit responsive to said difference voltage to generate a second logarithmic current signal having a second slope thereto, the magnitude of said second current signal being varied in a predetermined manner with respect to the magnitude of the linear voltage, said second slope being substantially equal to said first slope and of opposite polarity thereto.

* * * * *